United States Patent
Lee et al.

(10) Patent No.: US 6,841,860 B2
(45) Date of Patent: Jan. 11, 2005

(54) FLIP-CHIP BONDING STRUCTURE AND METHOD FOR MAKING THE SAME

(75) Inventors: Joo-Hoon Lee, Yongin-shi (KR); Duk-Yong Choi, Anyang-shi (KR); Dong-Su Kim, Anyang-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/244,196

(22) Filed: Sep. 16, 2002

(65) Prior Publication Data

US 2003/0205794 A1 Nov. 6, 2003

(30) Foreign Application Priority Data

May 3, 2002 (KR) ........................................ 2002-11511

(51) Int. Cl.⁷ ............................................. H01L 23/02
(52) U.S. Cl. ...................... 257/678; 257/688; 257/778; 257/797; 257/90; 257/94; 257/96; 257/97
(58) Field of Search ................................ 257/584, 678, 257/685, 687, 688, 698, 787, 797, 778, 90, 94, 89, 85, 96, 88, 97; 438/106, 121, 975, 117, 401, 108, 462, 22, 47, 46; 385/14; 372/50

(56) References Cited

U.S. PATENT DOCUMENTS

| | | | | |
|---|---|---|---|---|
| 4,148,559 A | * | 4/1979 | Gauthier | 385/55 |
| 5,369,529 A | * | 11/1994 | Kuo et al. | 257/678 |
| 5,923,057 A | * | 7/1999 | Son | 257/197 |
| 6,054,716 A | * | 4/2000 | Sonobe et al. | 257/603 |
| 6,127,716 A | * | 10/2000 | Morizuka et al. | 257/503 |
| 6,143,991 A | * | 11/2000 | Moriyama | 257/778 |
| 6,172,382 B1 | * | 1/2001 | Nagahama et al. | 257/94 |
| 6,323,059 B1 | * | 11/2001 | Yoshida et al. | 438/106 |
| 6,459,146 B2 | * | 10/2002 | Kono | 257/676 |
| 6,474,531 B2 | * | 11/2002 | Ozawa | 257/678 |

* cited by examiner

*Primary Examiner*—Donghee Kang
*Assistant Examiner*—Quang Vu
(74) *Attorney, Agent, or Firm*—Cha & Reiter, L.L.C.

(57) ABSTRACT

Disclosed are a flip-chip bonding structure for improving the vertical alignment of an optical device relative to a PLC and a flip-chip bonding method for achieving this structure. The flip-chip bonding structure includes: a semiconductor substrate; a lower-clad layer formed on the upper surface of the semiconductor substrate, wherein the lower-clad layer is depressed on a designated area for mounting an optical device; vertical alignment structures formed on a part of the upper surface of the depressed area of the lower-clad layer and determining a vertical alignment position of the optical device on the semiconductor substrate; electrodes formed on another part of the upper surface of the depressed area of the lower-clad layer; a solder bump formed on the upper surfaces of the electrodes; and, an optical device bonded to the substrate by a flip-chip bonding method using the solder bump.

7 Claims, 6 Drawing Sheets

FLIP-CHIP BONDING STRUCTURE AND METHOD FOR MAKING THE SAME

CLAIM OF PRIORITY

This application makes reference to and claims all benefits accruing under 35 U.S.C. Section 119 from an application entitled, "FLIP-CHIP BONDING STRUCTURE AND METHOD FOR MAKING THE SAME," filed in the Korean Industrial Property Office on Mar. 5, 2002 and there duly assigned Serial No. 2002-11511.

BACKGROUND OF THE INVENTION

1. Field of the Invention

The present invention relates to a flip-chip bonding technique for mounting an optical device on a PLC (Planar Lightwave Circuit), and more particularly to a flip-chip bonding structure and method for improving the degree of the vertical alignment of an optical device relative to a PLC.

2. Description of the Related Art

Generally, the flip-chip bonding technique is one of various methods of bonding a semiconductor device onto a substrate. Different from the conventional wire-bonding or soldering method, in the flip-chip bonding method an array of metal pads are first formed on the surfaces of both the semiconductor device to be bonded and the substrate. Then, solder bumps are placed on either the metal pads of the substrate or the metal pads of the semiconductor device, or both. The semiconductor device is mounted in an upside-down manner over the substrate so that the metal pads or the solder bumps of the semiconductor device are aligned with the corresponding metal pads or the solder bumps of the substrate. Thereafter, solder material of the solder bumps is heated and re-flowed to physically bond the semiconductor device to the substrate.

As the optical characteristics of the optical device are sensitive to the vertical alignment of the optical device relative to the substrate, a small error in the vertical alignment drastically deteriorates the optical characteristics of the optical device. Therefore, in order to connect the optical device to an optical waveguide, such as the PLC, a precise vertical alignment of the optical device relative to the optical waveguide is required. In order to align the optical device, such as a laser diode with the optical waveguide, a degree of precision of tolerance of less than ±1 μm is usually required.

FIG. 1 is a cross-sectional view of a conventional flip-chip bonding structure between an optical device and a PLC. As shown in FIG. 1, the PLC (Planar Lightwave Circuit) 10 comprises a silicon substrate 11, a lower clad layer 12, a core 13, and an upper clad layer 14. Furthermore, the PLC 10 comprises a metal electrode 15 and a solder bump 16. The metal electrode 15 and the solder bump 16 are deposited successively on an etched surface of a designated area of the PLC 10 for mounting the optical device 20. The designated area of the PLC 10 for mounting the optical device 20 is etched by a deep-etching method. Then, the optical device 20 provided with solder pads is bonded to the PLC 10 by the flip-chip bonding method using the surface tension of the solder bump 16 of the PLC 10. That is, after aligning the solder pad of the optical device 20 relative to the corresponding solder bump 16 located on the PLC 10, the optical device 20 and the PLC 10 are heated so as to re-flow the solder bump 16. As the solder bump 16 of the PLC 10 is re-flowed, the solder bump 16 assumes its most stable shape. The re-flowed solder bump 16 forms a bond between the optical device 20 and the PLC 10.

However, in the aforementioned prior art, the depth of the etched area of the PLC 10 from the upper-clad layer 14 to the lower-clad layer 12 is approximately 30 μm. Therefore, it is difficult to adjust precisely the depth of the etched area of the PLC 10 within a range of the required tolerance in the optical device 20. In addition, some error occurs in the thickness of the solder bump 16 formed by depositing a metal, which in turn deteriorates the optical characteristics. Furthermore, in the flip-chip bonding method, as the solder bumps of the PLC are re-flowed at high temperature and the optical device is bonded to the re-flowed solder bumps of the PLC, errors in the vertical alignment of the optical device relative to the PLC occur according to the bonding pressure and the re-flowing temperature, thereby seriously deteriorating the optical characteristics of the optical device further.

SUMMARY OF THE INVENTION

The present invention is related to a flip-chip bonding structure and its bonding method which has excellent bonding strength between an optical device and a PLC and avoids errors in the vertical alignment of the optical device relative to the PLC.

In accordance with one aspect of the present invention, the flip-chip bonding structure includes a semiconductor substrate; a lower-clad layer formed on the upper surface of the semiconductor substrate, wherein the lower-clad layer is depressed on a designated area for mounting an optical device; vertical-alignment structures formed on a part of the upper surface of the depressed area of the lower-clad layer for determining a vertical-alignment position of the optical device on the semiconductor substrate; electrodes formed on another part of the upper surface of the depressed area of the lower-clad layer; a solder bump formed on the upper surfaces of the electrodes; and, an optical device bonded to the substrate by a flip-chip bonding method using the solder bump.

Preferably, the thickness of the vertical alignment structure may be smaller than the total thickness of the electrode and the solder bump by over 0.5 μm.

Furthermore, preferably, the vertical alignment structure can be made of the same material as that of the lower clad layer.

More preferably, the vertical alignment structure may be made of silica.

In accordance with another aspect of the present invention, this invention provides a flip-chip bonding method comprising the steps of: forming a lower-clad layer and a core successively on a semiconductor substrate; etching the lower-clad layer and the core on a designated area for mounting an optical device so that the lower-clad layer is partially etched to leave the lower clad layer in a thickness that is necessary to align the optical device vertically on the semiconductor substrate; forming an upper-clad layer on the whole upper surface of the semiconductor substrate including the upper surface of the core and the etched surface of the lower-clad layer; forming steps on a part of the designated area for mounting the optical device by etching the upper-clad layer and the lower-clad layer on the designated area for mounting the optical device, wherein the steps serve as vertical-alignment structures; forming electrodes on the upper surface of the etched lower-clad layer of other parts of the designated area for mounting the optical device; depositing a solder bump on the upper surfaces of the electrodes; and, flip-chip bonding an optical device with bonding pads corresponding to the solder bump to the semiconductor substrate.

Preferably, the flip-chip bonding method can further comprise the step of forming an etching-stop layer on parts of the upper surface of the etched lower-clad layer of the designated area for mounting the optical device between the step of etching the lower-clad layer and the core on the designated area for mounting an optical device and the step of forming an upper-clad layer on the whole upper surface of the semiconductor substrate.

And, preferably, forming the steps can be carried out by etching the upper-clad layer and the lower-clad layer on the designated area for mounting the optical device by a deep dry-etching method using the etching-stop layer as an etching mask.

Furthermore, preferably, the etching-stop layer may be made of a material of whose selectivity to the lower clad layer is more than 10.

Moreover, preferably, the lower-clad layer can be made of silica.

Preferably, the etching-stop layer can be made of aluminum.

Further, preferably, the step of depositing the solder bump can be carried out so that the total thickness of the electrode and the solder bump is greater than the thickness of the step by over 0.5 µm.

BRIEF DESCRIPTION OF THE DRAWINGS

The above features and other advantages of the present invention will be more clearly understood from the following detailed description taken in conjunction with the accompanying drawings, in which:

FIG. 2b is a top view of the PLC of FIG. 2a;

DETAILED DESCRIPTION OF THE PREFERRED EMBODIMENTS

Figure 1:
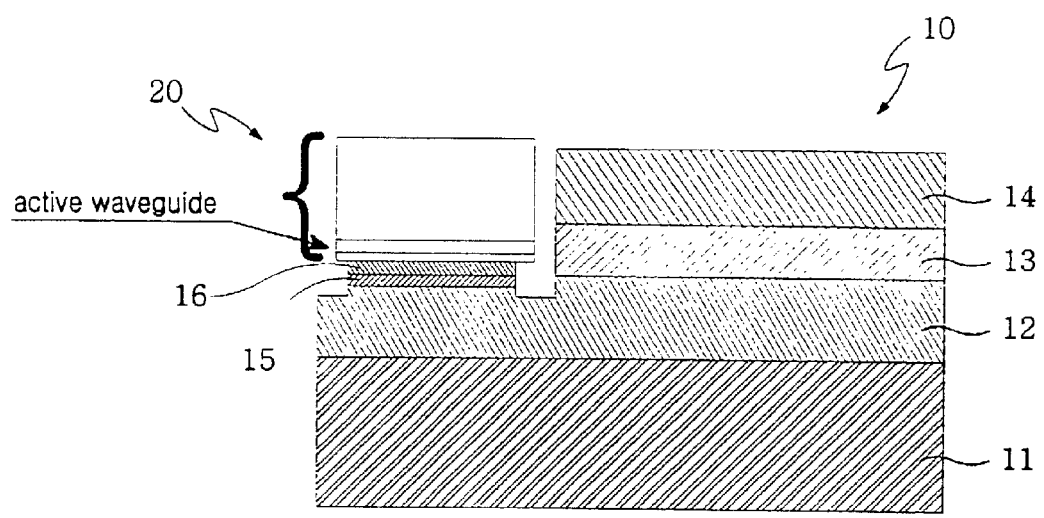
FIG. 1 is a cross-sectional view of a conventional flip-chip bonding structure between an optical device and a PLC (Planar Lightwave Circuit)

Now, preferred embodiments of the present invention will be described in detail with reference to the annexed drawings, i.e., FIGS. 2–5. In the drawings, the same or similar elements are denoted by the same reference numerals even though they are depicted in different drawings. For the purposes of simplicity and clarity, a detailed description of known functions and configurations incorporated herein will be omitted as it may confuse the subject matter of the present invention.

Figure 2A:
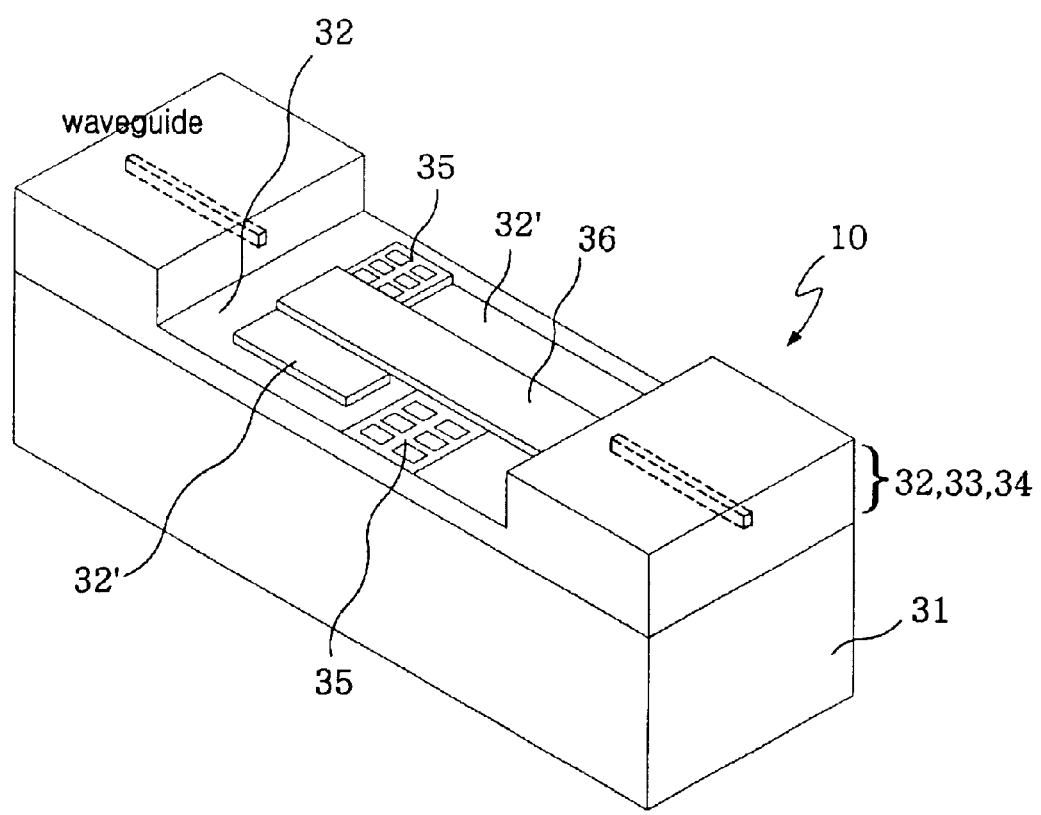
FIG. 2a is a perspective view of a PLC (Planar Lightwave Circuit) on which a vertical-alignment structure for flip-chip bonding is mounted in accordance with the present invention.
Figure 2B:
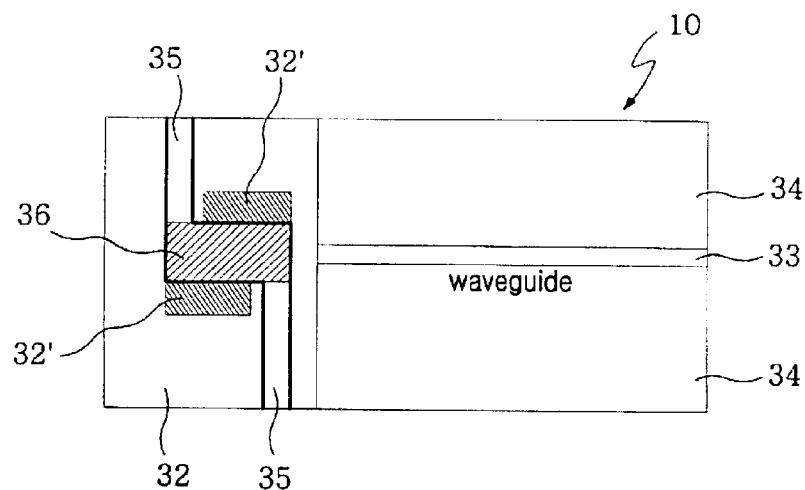
Figure 3:
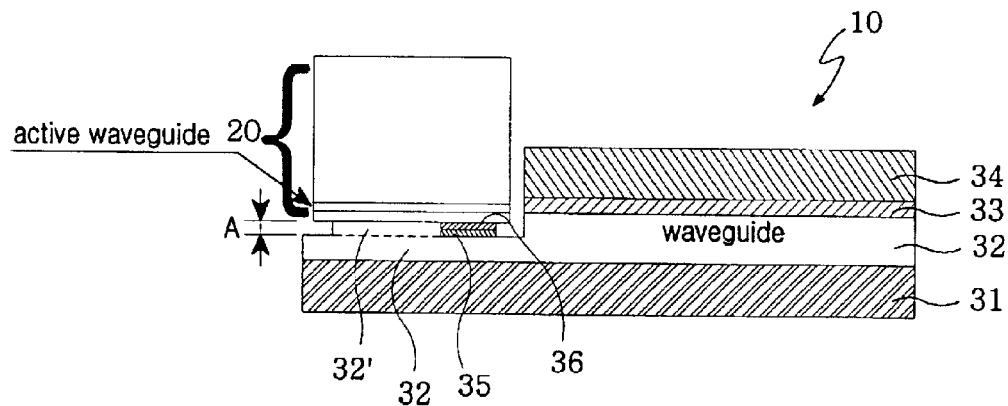
FIG. 3 is a cross-sectional view of a flip-chip bonding structure in accordance with the present invention.

FIG. 2a is a perspective view of a PLC (Planar Lightwave Circuit) on which a vertical-alignment structure for flip-chip bonding is mounted in accordance with the teachings of the present invention. FIG. 2b is a top view of the PLC of FIG. 2a. FIG. 3 is a cross-sectional view of a flip-chip bonding structure between an optical device 20 and the PLC 10 in accordance with the present invention.

As shown in FIGS. 2a, 2b, and 3, the vertical alignment structure 32' is formed on a part of a lower-clad layer 32 of the PLC 10. The vertical alignment structure 32' limits the vertical movement of an optical device when the optical device is bonded to the PLC 10 by the applied pressure, thereby determining the vertical position of the optical device on the PLC 10. As such, the vertical position of the optical device is determined by a thickness A of the vertical alignment structure 32'. The thickness A of the vertical alignment structure 32' must be at least greater than that of a metal electrode 35. Furthermore, the vertical alignment structure 32' is formed separately from the metal electrode 35 and a solder bump 36. Accordingly, when the solder bump 36 is re-flowed and the optical device is bonded to the PLC 10, the optical device is supported by the vertical alignment structure 32'. As a result, the change in the thickness of the solder bump 36 by the bonding pressure or the re-flowing temperature in the flip-chip bonding process does not influence the vertical position of the bonded optical device.

FIGS. 4a–4d are cross-sectional views showing the flip-chip bonding process for forming the vertical alignment structure 32' in accordance with the teachings of the present invention.

Figure 4A:
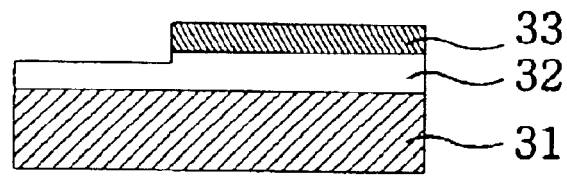
FIGS. 4a–4d are cross-sectional views showing a flip-chip bonding process in accordance with the present invention; and, FIG. 5 is a top view of the PLC of FIG. 4b.

First, as shown in FIG. 4a, a silicon substrate 31 is prepared. A lower-clad layer 32 and a core 33 are deposited successively on the upper surface of the silicon substrate 31 and then patterned. The lower-clad layer 32 is made of silica. The lower-clad layer 32 and the core 33 disposed on a designated area for mounting an optical device are etched. Note that the thickness of the etched area is determined so that the lower-clad layer 32 is partially etched to leave the lower-clad layer 32 in a thickness necessary to align subsequently the optical device relative to the PLC 10.

Figure 4B:
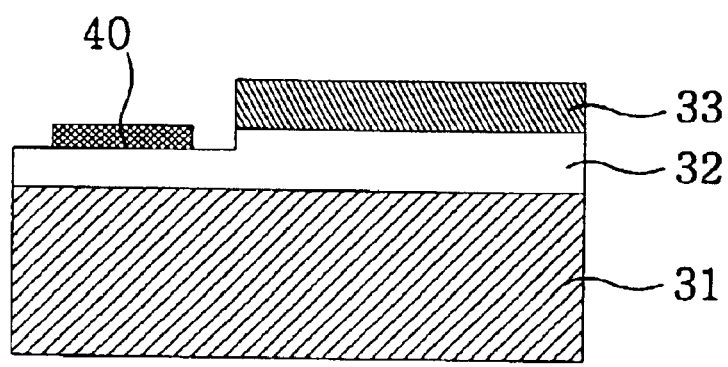

As shown in FIG. 4b, an etching-stop layer 40 is formed on the etched surface of the lower-clad layer 32 and then patterned. The etching-stop layer 40 is made of a proper ceramic material or aluminum, of which physical properties do not change when an upper-clad layer 34 is deposited subsequently thereon and of which selectivity to the underlying material, i.e., the lower-clad layer 32 made of silica, is more than 10. The etching-stop layer 40 is formed in a thickness of approximately 0.5 µm.

Figure 5:
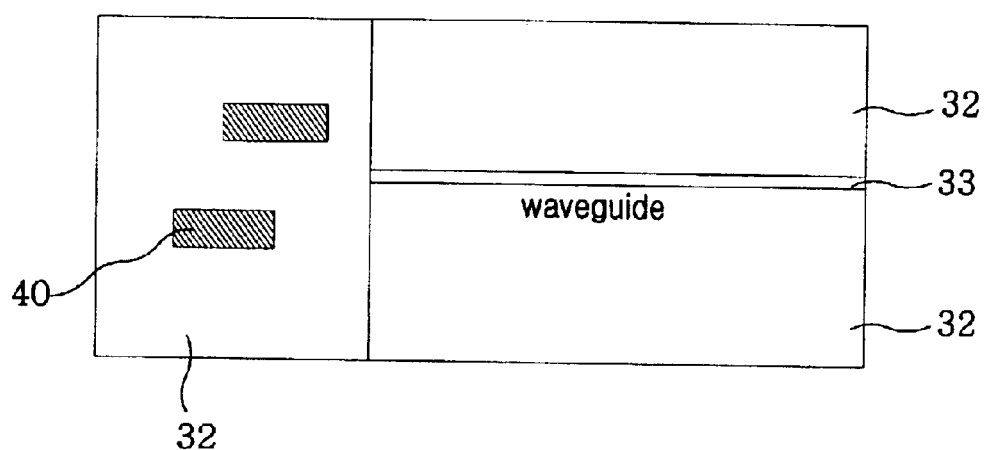

FIG. 5 is a top view of the PLC of FIG. 4b. FIG. 5 shows positions of forming the etching-stop layers 40 on the etched surface of the lower-clad layer 32 of the PLC 10. Note that these positions of the etching-stop layers 40 will be positions for the vertical alignment structures 32'.

Figure 4C:
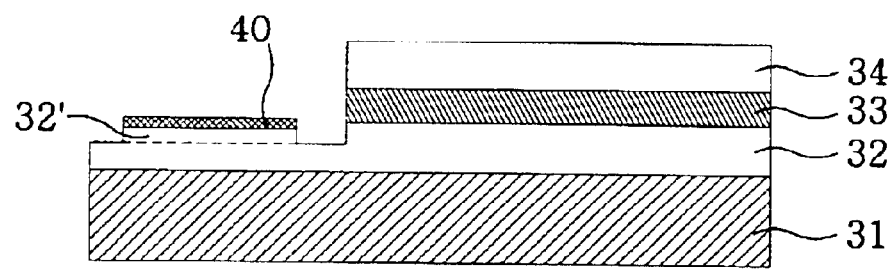

As shown in FIG. 4c, the upper-clad layer 34 is deposited on the whole upper surface of the silicon substrate 31 including the upper surface of the core 33, the etched surface of the lower-clad layer 32, and the upper surfaces of the etching-stop layers 40. Then, a portion of the upper-clad layer 34 and the etched lower-clad layer 32 are removed from the area for mounting the optical device by a deep dry-etching method. As the etching-stop layer 40 serves as an etching mask, a part of the lower-clad layer 32 under the etching-stop layer 40 is not etched. Therefore, the upper surface of the etching-stop layer 40 and the upper surface of the etched lower-clad layer 32 are stepped. As the thickness A of the step is within 10 µm, it is possible to avoid errors in the deep dry-etching process. Preferably, the step is constructed so that the thickness A of the step is smaller than the total thickness of metal electrodes and a solder bump to be subsequently formed by over 0.5 µm. Accordingly, this step on the lower-clad layer 32 functions as the vertical alignment structures 32' for limiting the vertical movement of the optical device bonded to the PLC by the flip-chip bonding method.

Figure 4D:
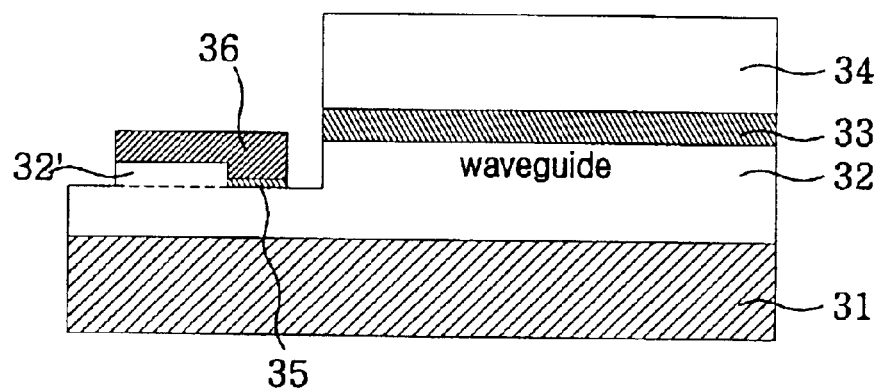

Finally, as shown in FIG. 4d, the metal electrodes 35 and the solder bump 36 are deposited successively on the upper surface of the etched area of the lower-clad layer 32 (see also FIG. 2b). Note that the thickness of the solder bump 36 deposited on the metal electrodes 35 is controlled so that the total thickness of the metal electrode 35 and the solder bump 36 is greater than that of the vertical alignment structure 32'. Although not shown in FIG. 4d, the optical device 20 provided with the bonding pad corresponding to the solder bump 36 is aligned relative to the PLC 10. Then, the solder bump 36 is heated and re-flowed to bond the optical device to the PLC 10 by the flip-chip bonding method.

As apparent from the above description, the present invention provides a flip-chip bonding structure in which vertical-alignment structures for determining the vertical position of an active device such as the optical device on the PLC are formed on a designated area for mounting the optical device, thereby avoiding vertical-alignment errors in bonding the optical device to the PLC and preventing the deterioration of the optical characteristics of the optical device.

Although the preferred embodiments of the present invention have been disclosed for illustrative purposes, those skilled in the art will appreciate that various modifications, additions, and substitutions are possible without departing from the scope and spirit of the invention as disclosed in the accompanying claims.

What is claimed is:

1. A flip-chip bonding structure comprising:
   a semiconductor substrate;
   a lower-clad layer formed on the upper surface of the semiconductor substrate having a mounting area for mounting an optical device;
   at least two vertical alignment structures formed on a part of the upper surface of the mounting area of the lower-clad layer for determining a vertical alignment position of the optical device on the semiconductor substrate;
   at least two electrodes formed on another part of the upper surface of the mounting area of the lower-clad layer; and,
   a solder bump formed on the upper surfaces of the electrodes;
   wherein each one of said at least two vertical alignment structures forms a respective step an the lower-clad layer that is adjacent one of said at least two electrodes, said step limiting vertical displacement of the optical semiconductor device on the semiconductor substrate.

2. The flip-chip bonding structure as set forth in claim 1, wherein the optical device is bonded to the substrate by a flip-chip bonding method using the solder bump.

3. The flip-chip bonding structure as set forth in claim 1, wherein the thickness of the step is greater than a thickness of a respective one of the at least two electrodes, and wherein the thickness of the step is smaller than a total thickness of the electrode and the solder bump by over 0.5 $\mu$m.

4. The flip-chip bonding structure as set forth in claim 1, wherein the vertical alignment structure is made of the same material as that of the lower-clad layer.

5. The flip-chip bonding structure as set forth in claim 4, wherein the vertical alignment structure is made of silica.

6. The flip-chip bonding structure as set forth in claim 1, wherein the vertical alignment structures provide a limit on the vertical movement of the optical device.

7. The flip-chip bonding structure as set forth in claim 1, wherein the thickness of the vertical alignment structures is at least greater than that of the electrodes.

* * * * *